United States Patent [19]

Scherer et al.

[11] Patent Number: 5,399,252

[45] Date of Patent: Mar. 21, 1995

[54] APPARATUS FOR COATING A SUBSTRATE BY MAGNETRON SPUTTERING

[75] Inventors: Michael Scherer, Rodenbach; Wolfram Maass, Erlensee; Joachim Szczyrbowski, Goldbach, all of Germany

[73] Assignee: Leybold Aktiengesellschaft, Hanau, Germany

[21] Appl. No.: 148,596

[22] Filed: Nov. 8, 1993

[30] Foreign Application Priority Data

Nov. 6, 1992 [DE] Germany ............... 42 37 517.1

[51] Int. Cl.6 .............................................. C23C 14/35
[52] U.S. Cl. ........................... 204/298.19; 204/298.08; 204/298.11
[58] Field of Search .............. 204/298.08, 298.12, 204/298.19, 298.11

[56] References Cited

U.S. PATENT DOCUMENTS

| 4,046,659 | 9/1977 | Cormia et al. | 204/192.12 |
| 4,198,283 | 4/1980 | Class et al. | 204/298.12 |
| 4,370,217 | 1/1983 | Funaki | 204/298.12 |
| 4,401,539 | 8/1983 | Abe et al. | 204/192.13 |
| 4,724,296 | 2/1988 | Morley | 219/121.54 |
| 4,887,005 | 12/1989 | Rough et al. | 315/111.21 |
| 4,956,070 | 9/1990 | Nakado et al. | 204/298.18 |
| 5,066,381 | 11/1991 | Ohta et al. | 204/298.12 |
| 5,082,546 | 1/1992 | Szczyrbowski et al. | 204/298.08 |
| 5,126,032 | 6/1992 | Szczyrbowski et al. | 204/298.08 |
| 5,133,850 | 7/1992 | Kukla et al. | 204/298.12 |
| 5,167,789 | 12/1992 | Latz | 204/298.11 |
| 5,169,509 | 12/1992 | Latz et al. | 204/298.03 |

FOREIGN PATENT DOCUMENTS

| 2023509 | 2/1991 | Canada | 204/298.12 |
| 3541621 | 5/1987 | Germany | 204/192.2 |
| 252205 | 12/1987 | Germany | 204/298.19 |
| 3802852 | 10/1990 | Germany | 204/298.08 |
| 61-110763 | 5/1986 | Japan | 204/298.19 |

*Primary Examiner*—Aaron Weisstuch
*Attorney, Agent, or Firm*—Felfe & Lynch

[57] ABSTRACT

A pair of magnetron cathodes in an evacuable coating chamber are connected to the outputs of the secondary winding of a transformer, the primary winding being connected to the outputs of a medium frequency A.C. generator. An oval target is mounted on each cathode and surrounded by stainless steel bars. As an alternative the bars may be configured as plates connected to ground and mounted to the target by insulating spacers.

10 Claims, 4 Drawing Sheets

APPARATUS FOR COATING A SUBSTRATE BY MAGNETRON SPUTTERING

Background of the Invention

The invention relates to an apparatus for coating a substrate, especially with electrically non-conductive coatings from electrically conductive targets in a reactive (e.g., oxidizing) atmosphere. An electric power source is connected with two cathodes each having magnets and disposed in an evacuable coating chamber, which cooperate electrically with the targets being sputtered, and whose sputtered particles deposit themselves on the substrate. Two anodes separated electrically from one another and from the sputtering chamber are provided in a plane between the two cathodes and the substrates. A gas discharge plasma is produced between the cathodes and the two anodes in order to produce the ions necessary for the bombardment of the cathodes connected to an alternating current.

A sputtering apparatus for the production of thin coatings is already known (DD 252 205), consisting of a magnet system and at least two electrodes of the material to be sputtered disposed above it, these electrodes being electrically configured so that they are alternately cathode and anode of a gas discharge. The electrodes are for this purpose connected to a sinusoidal alternating voltage of preferably 50 Hz.

This known sputtering apparatus is intended to be suitable especially for the deposition of dielectrical coatings by reactive sputtering. The operation of the apparatus at approximately 50 Hz is intended to prevent sparkles at the anode and, in the case of metal coating, the formation of electrical short-circuits (so-called arcing).

U.S. Pat. No. 4,956,070 discloses apparatus for sputtering of a thin film, in which the rate of the deposit of layers of different materials can be controlled in order to arrive at extremely thin coating strata, at least two different kinds of targets are disposed on the cathode side.

Also known is a system for depositing a metal alloy by means of high-frequency cathode sputtering (DE 35 41 621), in which two targets are operated alternately, the targets containing the metal components of the metal alloy to be deposited, but in different proportions. The substrates are for this purpose disposed on a substrate holder which is set in rotation by a drive unit during the sputtering process.

In a published disclosure (DE 38 02 852) it has also been known, in the case of an apparatus for coating a substrate, having two electrodes and at least one material to be sputtered, to dispose the substrate to be coated between the two electrodes at a distance apart, and to select the half-cycles of the alternating current as low-frequency half-cycles with substantially equal amplitudes.

According to another published disclosure (DE 22 43 708) a method and an apparatus for producing a glow discharge is known, having an electrode system set up in a working gas, to which a working voltage is applied, a magnetic field being produced which, together with the electrode system, results in a trap for capturing virtually all the electrons emitted by the electrode system which have enough energy to ionize the working gas. For this method an electrode system is used in which the electrodes are provided in pairs. This disclosure especially also describes hollow electrodes in whose interior a glow discharge can be produced, the electrodes being configured as tube shells.

U.S. Pat. No. 5,169,509 discloses a method and apparatus for the reactive coating of a substrate with an electrically insulating material, e.g., with silicon dioxide ($SiO_2$). An alternating current source is connected with cathodes enclosing magnets and disposed in a coating chamber, which cooperate with targets. Two ungrounded outputs of the alternating current source are each connected with a cathode bearing a target, both cathodes being provided side-by-side in the coating chamber in a plasma space, each being at approximately the same distance from the oppositely located substrate. The effective value of the discharge voltage is measured by an effective voltage detector connected by a conductor to the cathode and delivered as direct current to a controller which by means of a control valve controls the reactive gas flow from the tank to the manifold line such that the measured voltage agrees with a set voltage.

U.S. Pat. No. 5,126,032 discloses apparatus for the reactive coating of a substrate in which a cathode electrically separated from the vacuum chamber and configured as a magnetron cathode consists of two parts electrically separated from one another. The target base body with yoke and magnet as the one part is connected—with the interposition of a capacitor—to the negative pole of a direct-current voltage source, and the target as the other part is connected by a conductor to the power source with the interposition of an inductive coil and a resistance parallel to the latter. The target is connected through an additional capacitor to the positive pole of the power source and to the anode which in turn—with the interposition of a resistor—is at ground potential.

U.S. Pat. No. 4,046,659 discloses a method for coating a substrate by reactive cathode sputtering in which an anode and a sputtering cathode (target) of conductive material are disposed in an evacuable chamber, and between them a gas discharge plasma is sustained in order to produce the ions necessary for the bombardment of the sputtering electrode, which is at an alternating voltage. The chamber contains a reactive gas under a certain partial pressure, which in reacting with the target material forms an insulating compound. A portion of the target becomes coated with the insulating coating formed in the reactive sputtering, while the remainder of the target surface remains free, due to ion bombardment, of the insulating coating. An energy source with arc suppressing circuit is used, the alternating current applied to the sputtering electrode having a frequency that is greater than 400 Hz and less than 60,000 Hz.

Canadian Patent No. 2,023,509 (EP 0 413 354) discloses a planar magnetron cathode which is suitable for a reactive direct-current sputtering process, and in which one or more targets of the material to be sputtered are fixedly disposed on a planar back plate. Masks of electrically insulating material such as glass or ceramic are cemented on both sides of the erosion pit that forms during the coating process to prevent these portions from arcing.

Experience shows that, on an initially metallically bright surface of the target, a thin coating of electrically insulating oxides of the target material forms, which is then the cause of the arcing. If these portions are first covered with masks of a nonconductor, then no flashovers occur in the covered portions, since the cemented masks, in comparison with deposited coatings, of for example an oxide of the target material, are much thicker, and thus prevent such arcing.

SUMMARY OF THE INVENTION

The apparatus of the present invention detects the arcing that occurs during the process of coating by means of a magnetron sputtering source, doing so in an early phase of the process, in which the tendency to form an arc increases, and counteracts it. Further, the apparatus prevents the occurrence, especially in the case of critical sputtering materials (silicon for example), of any substrate damage due to sparkles or to spattering by material particles.

The apparatus is designed so that the peculiarities of apparatus of extreme size will have no negative effect on the long-term stability of the process and the reliability and performance of the apparatus.

According to the invention, an electrical power source is connected electrically to two cathodes disposed in an evacuable chamber, each having magnets, which cooperate electrically with the targets which are sputtered and whose sputtered particles deposit themselves on the substrate. Two anodes electrically separated from one another and from the sputtering chamber are provided in a plane between the cathodes and the substrate. A gas discharge plasma can be produced between the two cathodes and the two anodes in order to produce the ions necessary for the bombardment of the cathodes. The cathodes carry an alternating voltage at a frequency that is greater than 40 Hz and less than 60,000 Hz, for which purpose the two output terminals of the secondary winding of a transformer connected to a medium frequency generator are connected each to a cathode via supply conductors. The first and the second supply conductor are connected to one another via a branch conductor into which an oscillating circuit is inserted and wherein—parallel to each of the erosion areas of the target—strips or pieces cut from thin profile materials or sheets are disposed. The strips are formed of a material different from the target material, preferably a high-melting high-grade steel or a ceramic, the strips or pieces being connected to the target base plate and/or to the magnetic yoke, or being held by the latter.

Each of the two supply conductors is preferably connected via a first network establishing the DC potential versus the ground to the coating chamber as well as via a corresponding second network to the particular anode.

Advantageously, each of the two supply conductors is connected to the coating chamber both via a first electrical circuit setting the DC potential versus the ground and, via a corresponding second electrical circuit, to the particular anode, and via branch lines, with the interposition of a condenser, to the coating chamber. For the damping of surges an inductor is inserted into the first connecting line from the connection of the secondary winding to the cathode between the oscillating circuit and the winding terminal.

It is therefore important to fire the cathodes "soft," which can be done by means of the inductor inserted between the transformer and the medium frequency generator. Furthermore, an inverting system is provided between the cathodes, which can be excited to inversion by an arc and which extinguishes the arc when it inverts. The inherent resonance of the oscillating circuit must be a multiple of the working frequency of the system.

DETAILED DESCRIPTION OF THE PREFERRED EMBODIMENT

Figure 1:
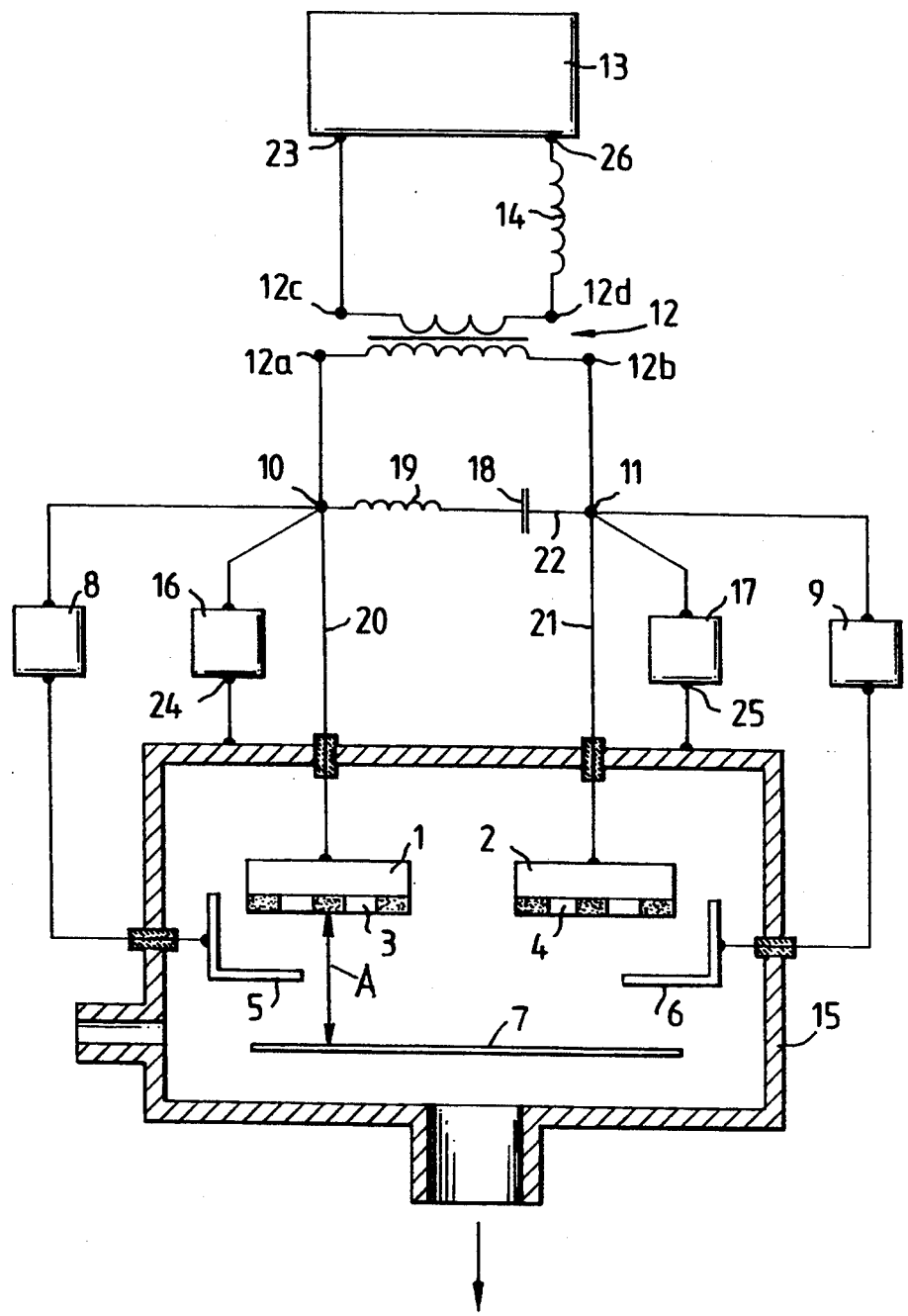
FIG. 1 shows the circuit diagram of a two-cathode system.

According to FIG. 1, in the coating chamber 15 two cathodes 1, 2 are fed with sinusoidal alternating current of a frequency of 40 kHz such that the cathodes alternately constitute the minus and the plus pole of the sputtering discharge.

In the coating chamber 15 the two magnetron cathodes 1, 2 are disposed so close to one another that a plasma can be ignited between the two cathodes. At the same time the cathodes are so oriented that the surfaces of the targets 3, 4 disposed on the cathode lie in one plane and parallel to the plane of the substrate 7 or at an angle to one another and to the substrate plane.

Between the targets 3, 4 and the substrate plane a distance A is maintained. In this space the electrodes 5, 6 are disposed, which are connected via the electrical networks 8 and 9 to the cathodes 1 and 2 at points 10 and 11, respectively.

At the junctions 10 and 11 of the feeder lines 20, 21 each of the cathodes 1 and 2 are furthermore connected to a respective terminal 12a, 12b of the secondary winding of the transformer 12. This transformer receives its energy from the medium frequency generator 13 in which an output terminal 26 of this medium frequency generator is connected to a terminal 12d of the primary winding of transformer 12 via inductor coil 14, the other output terminal 23 of the medium frequency generator 13 being connected directly to the other terminal 12c of the primary winding of the transformer 12.

The junctions 10 and 11 are furthermore connected to the networks 16 and 17, respectively. The second terminals 24, 25 of the networks 16, 17 are each connected to the coating chamber 15. At the junction 10 the one terminal of a coil 19 is connected, whose second terminal is connected to the terminal of the condenser 18. The second terminal of the condenser is connected to the junction 11 through the branch line 22.

The networks 8, 9 and 16, 17 consist of series circuits of diodes, resistors, and condensers and together set the direct-current potential with respect to the ground.

In the system described above, the medium frequency generator 13 produces a sinusoidal alternating voltage which is raised by the transformer 12 so that the voltage range is adapted to the working voltage of the magnetron cathodes 1, 2. An electrical connection exists between the two cathodes, in which the alternating current is induced via the transformer 12. Thus at one moment in time the cathode 1 forms the minus pole, i.e., the sputtering part of the discharge, and cathode 2 forms the plus pole of the discharge. At another moment the cathode 1 forms the plus pole of the discharge and cathode 2 is the minus pole and thus sputters.

The frequency of the medium-frequency voltage is selected to be so low that the plasma discharge is extinguished upon each null of the alternating current. It reignites in each half-wave of the alternating current as soon as the voltage at transformer 12 has risen sufficiently.

This interplay provides for the discharge always to find a surface cleaned by sputtering as the plus pole. The alternating frequency must be made so high that the coating of areas alongside the target erosion pattern is prevented.

Since the physical mechanism is identical to direct-current sputtering, naturally arcs also occur. But arcing is connected not only with conditions at the target surface but also with time and with current and potential conditions (therefore the alternating frequency is selected to be so high that the polarity has already changed before the arc could form). The coil 14 produces a delay in the current rise, both in the firing and in the forming of the arc. The oscillator constituted by the coil 19 and the condenser 18 is set at a frequency that is substantially higher than the working frequency—approximately 50 times higher. If an arc should form, this oscillator oscillates and causes an additional change in the polarity of the cathodes so that the arc immediately vanishes. The networks 8, 9 and 16, 17 provide for the potentials of the electrodes 5, 6 and of the coating chamber 15 to be kept such that low field strengths occur in the chamber 15 and thus also delay arcing. The virtual freedom from arcing is achieved by the combination of these measures: two electrically connected cathodes of the kind described below, the frequency, the inductor coils and the networks for setting the potential.

Figure 2:
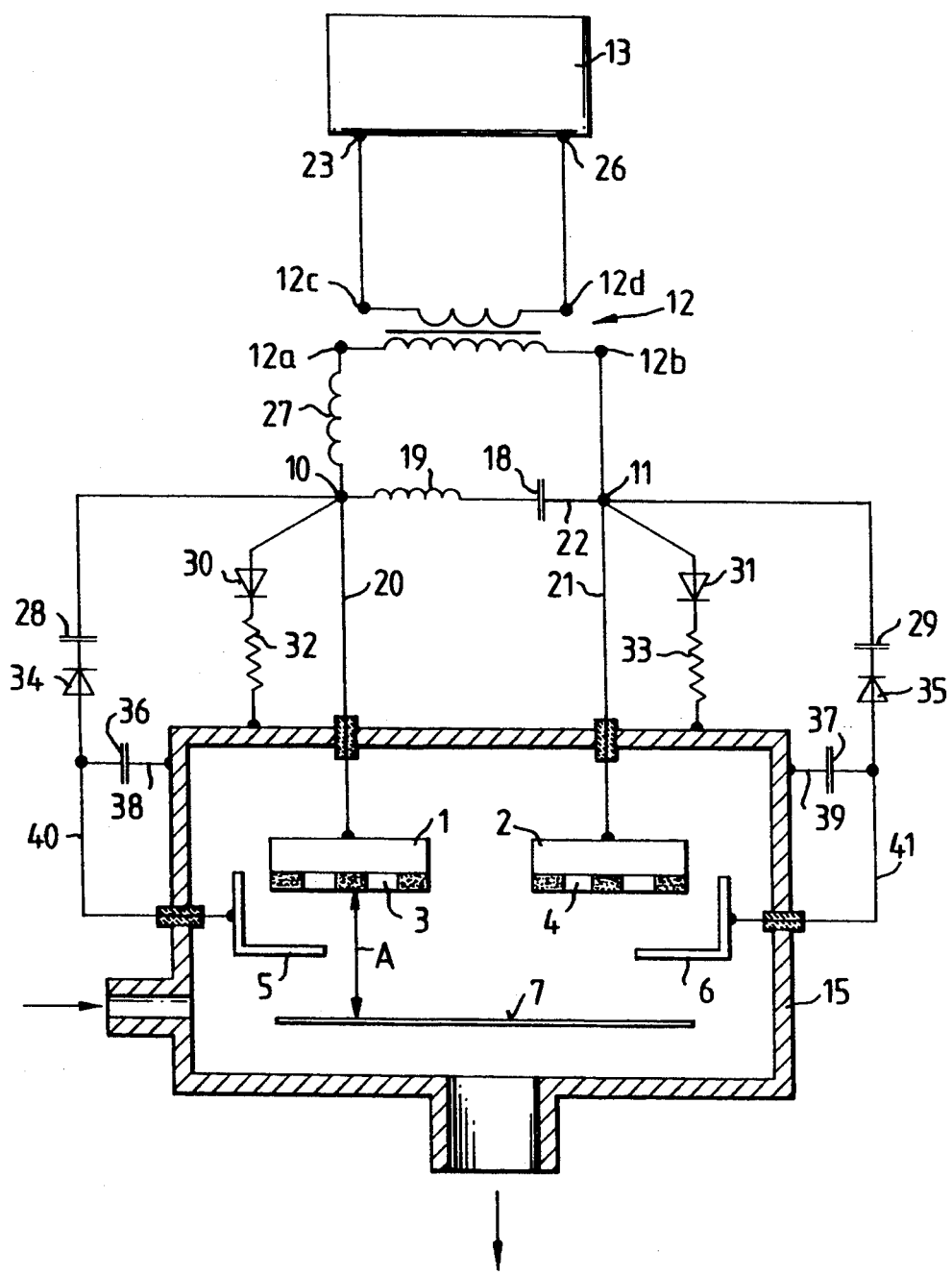
FIG. 2 shows the circuit diagram of an alternative embodiment of the two-cathode system of FIG. 1.

In the embodiment according to FIG. 2, two cathodes 1, 2 in the coating chamber 15 are fed with sinusoidal alternating current of a frequency of 40 kHz such that the cathodes are alternately the minus pole and the plus pole of the sputtering discharge.

In the space A the electrodes 5, 6 are disposed, which are connected by an electrical circuit, consisting in each case of a condenser 28 and 29 and a diode 34 and 35, respectively, to the cathodes 1 and 2 at points 10 and 11, respectively.

At the junctions 10 and 11 of the feeders 20 and 21, the cathodes 1 and 2 are furthermore each connected to a terminal 12a, 12b of the secondary winding of the transformer 12, a choke coil 27 being inserted into the line connecting point 12 to terminal 12a. This transformer 12 receives its energy from the medium frequency generator 13, one output terminal 23 of this medium frequency generator 13 being connected to one terminal 12c of the primary winding of the transformer 12, and the other terminal 12d of the primary winding of transformer 12 being connected to the second terminal 26 of the generator 13.

Junctions 10 and 11 are furthermore also connected to the diodes 30 and 31, respectively, which are connected to resistances 32 and 33, respectively. The resistances 32 and 33 are each connected to the coating chamber 15. The one terminal of a coil 19 is connected to the junction 10 and its second terminal is connected to one terminal of condenser 18. The second terminal of condenser 18 is connected to the junction 11 via the branch line 22. The electrical circuits each constituted of a resistance 32 and 33 and a diode 30 and 31, respectively, together establish the direct-current potential with respect to ground. It is also to be noted that the electrical components 28, 34 and 29, 35 are connected to the chamber 15 via branch lines 38, 39 into which respective condensers 36, 37 are inserted.

In the arrangement according to FIG. 2, the medium-frequency generator 13 produces a sinusoidal alternating voltage which is raised by the transformer 12 so that the voltage range is adapted to the working voltage of the magnetron cathodes 1, 2. The circuit described—cathode 1, transformer 12 to cathode 2—implies that between the two cathodes an electrical connection exists in which the alternating voltage is induced via the transformer 12. In this manner it is brought about that, at one moment cathode 1 forms the minus pole, i.e., the sputtering part of the discharge, and cathode 2 forms the plus pole of the discharge. At another moment cathode 1 forms the plus pole of the discharge and cathode 2 is the minus pole and therefore sputters.

The frequency of the medium-frequency voltage is then made so low that the plasma discharge is extinguished at each null of the alternating voltage and fires again at each half-wave of the alternating voltage as soon as the voltage at transformer 12 has risen sufficiently.

The inductor 27 causes a delay in the current rise both during firing and during the formation of the arc. The oscillating circuit formed by the coil 19 and the condenser 18 is adjusted to a frequency that is substantially higher than the working frequency—about 50 times higher. If an arc should form, this oscillating circuit oscillates and causes an additional change in the polarity of the cathodes, so that the arc immediately vanishes. The electrical components 28, 34 and 29, 35 cause the potentials of the electrodes 5, 6 and the coating chamber 15 to be maintained so that low field strengths occur in chamber 15 and thus also delay arcing. This virtual freedom from arcing is achieved by the combination of the following means: two electrically connected cathodes 1, 2, oscillator 18, 19, inductor 27, electrical components 28, 34; 29, 35; 30, 32; and 31, 33 for the establishment of the potential.

The above described circuit is also described in U.S. application Ser. No. 07/900,580 filed Jun. 26, 1992. A similar circuit is described in allowed U.S. application Ser. No. 07/900,575 filed Jun. 26, 1992 and incorporated herein by reference.

Figure 3:
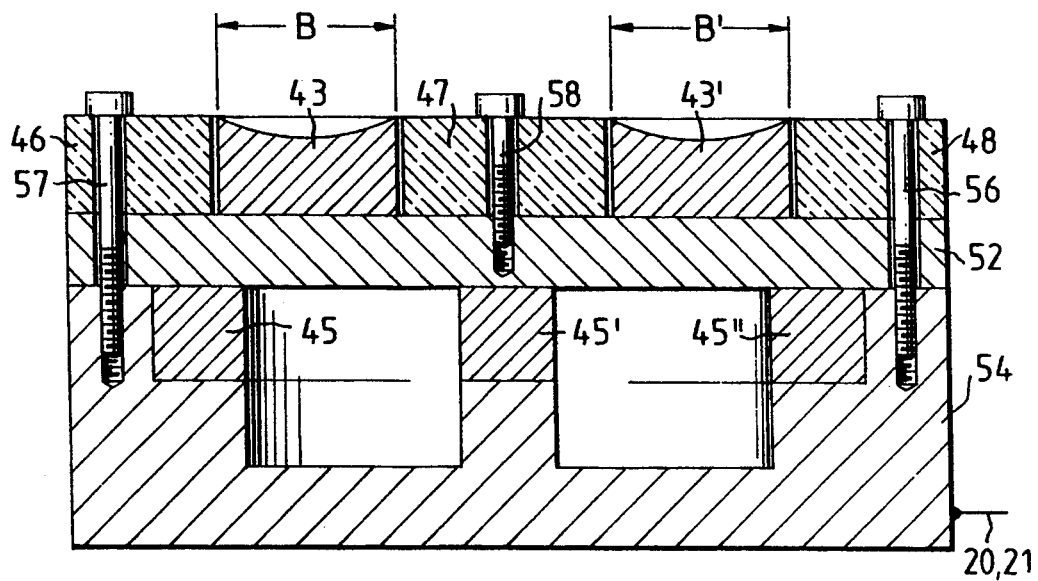
FIG. 3 shows the cross-section through a cathode.
Figure 4:
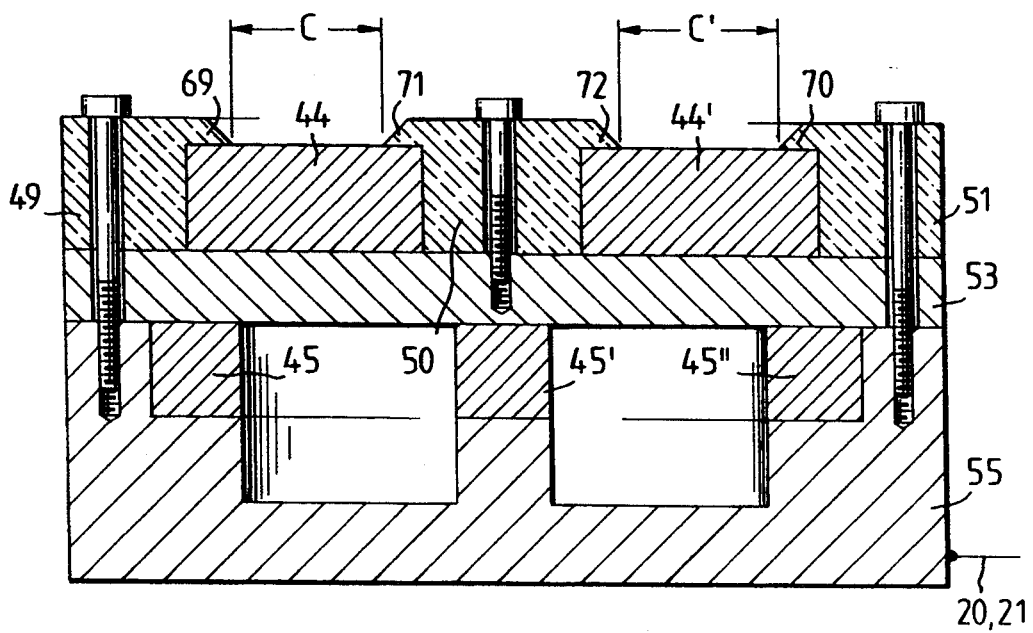
FIG. 4 shows the cross-section through an alternative embodiment of the cathode.
Figure 5:
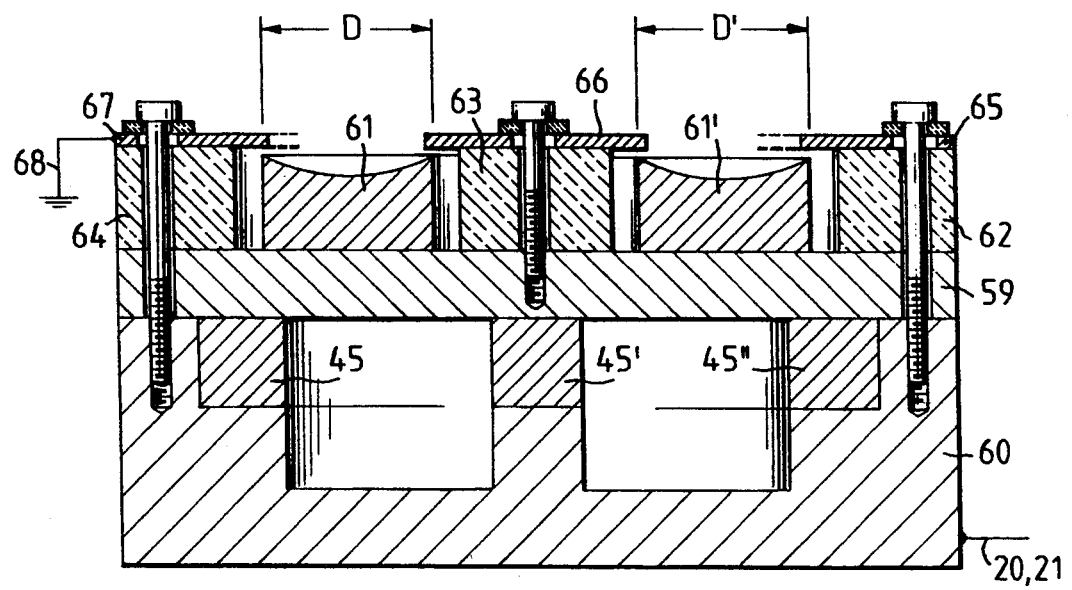
FIG. 5 shows the cross-section through a third embodiment of the cathode.

The cathodes 1, 2 represented in FIGS. 1 and 2, enlarged and shown in longitudinal section in FIGS. 3 to 5, will be further described, the individual parts themselves being given different numbers in these enlarged representations.

As FIG. 3 shows, the cathodes each include a magnet yoke 54 with the permanent magnet 45, a target base plate 52, the target 43 forming an oval ring (of conductive Si, for example), and the bars 46, 47, 48 of high melting point steel, preferably stainless steel, enframing the target 43. The bars 46, 48 form an oval ring around the target while the bar 47 is situated centrally.

The outside bars 46 and 48 are fastened by respective screws 57 and 56 onto the magnet yoke 54, and the inside bar 47 is affixed to the target base plate by means of a screw 58.

During the operation of the apparatus, the erosion zones B, B' of the silicon target 43, 43' remain clear, while the bars 46, 47, and 48 are coated with a very thin layer of silicon dioxide. If a piece of the sputtered coating spalls off, e.g. due to thermal expansion, the spalling does not create irregularities in the surface of the high grade steel, which remains absolutely smooth. This avoids arcing, because an uneven or rough surface permits charge concentration and thus promotes arcing.

The danger of contamination of the substrate as the result of an arc, however, is virtually eliminated, since the above-described circuit almost completely eliminates such arcs. If nevertheless an arc—even a low-energy arc—should occur, no spattering will occur, since the material of the bars has an extremely high melting point, and therefore there is no danger that particles of the bar material will be melted and form pinholes on the substrate.

Although in the embodiment represented in FIG. 3 the bars 46, 47, 48 enframing the target are very close to the target 43, the bars 49, 50, 51 in FIG. 4 are shaped so that with an edge facing the substrate 7 they overlap the target 44 and draw it tightly against the target base plate 53. Otherwise operation is the same as that of the bars 46, 47, 48 in FIG. 3.

The bars enframing the target can, however, be configured as sheet-metal pieces 65, 66, 67 (FIG. 5), which overlap the target 61, 61' partially in the manner of masks, with a gap, and otherwise are electrically insulated from the target base plate 59 by means of ceramic spacers 62, 63, 64. In such a case no arcs whatever can occur if the metal pieces are also grounded by a conductor 68.

We claim:

1. Apparatus for coating a substrate by magnetron sputtering, comprising
   an evacuable coating chamber,
   at least one magnetron cathode in said coating chamber,
   a target associated with each said at least one cathode, said target comprising an oval ring of material to be sputtered,
   bar means of stainless steel including outer bar means surrounding said oval ring and inner bar means located centrally of said oval ring, and
   insulating means between said bar means and said cathode, said bar means comprising stainless steel plates fixed to said insulating means, said stainless steel plates being electrically grounded.

2. Apparatus as in claim 1 further comprising screw means fixing said bar means to each said at least one cathode.

3. Apparatus as in claim 2 wherein each said magnetron cathode comprises a magnetic yoke and a target base plate between said magnetic yoke and said target, said screw means fixing said outer bar means to said magnetic yoke and said inner bar means to said target base plate.

4. Apparatus as in claim 1 wherein said bar means have marginal portions which overlap said target and serve to retain said target to said cathode.

5. Apparatus as in claim 1 comprising two said magnetron cathodes, said apparatus further comprising
   a pair of anodes between said cathodes and the substrate, and anodes being separated electrically from one another,
   an A.C. generator having two output terminals,
   a transformer having a primary winding and a secondary winding, said primary winding being connected to said output terminals of said A.C. generator, said secondary winding having two output terminals,
   first and second supply lines connecting respective said output terminals to respective said cathodes, and
   resonant circuit means connecting said first supply line to said second supply line.

6. Apparatus as in claim 5 further comprising
   rectifying circuit means connecting said first supply line to said second supply line in parallel with said resonant circuit means.

7. Apparatus for coating a substrate by magnetron sputtering, comprising
   an evacuable coating chamber,
   at least one magnetron cathode in said coating chamber,
   a target associated with each said at least one cathode, said target comprising an oval ring of material to be sputtered,
   stainless steel plate means including outer stainless steel plate means surrounding said target and inner stainless steel plate means located centrally of said oval ring, said stainless steel plate means being exposed in a direction facing away from said cathode, and
   electrical insulating means located between said stainless steel plate means and said cathode.

8. Apparatus as in claim 7 further comprising grounding means for maintaining said stainless steel plate means at ground potential.

9. Apparatus as in claim 7 further comprising
   screw means for fixing said stainless steel plate means to said cathode, and
   electrical insulating means for insulating said screw means from said stainless steel plate means.

10. Apparatus as in claim 7 said outer and inner stainless steel plate means have marginal portions which overlap said target but are spaced therefrom.

* * * * *